(12) United States Patent
Kishida et al.

(10) Patent No.: US 6,756,975 B1
(45) Date of Patent: Jun. 29, 2004

(54) MATRIX TYPE DISPLAY APPARATUS, METHOD OF PRODUCTION THEREOF, AND THERMO-COMPRESSION BONDING HEAD

(75) Inventors: Katsuhiko Kishida, Kawasaki (JP); Hirofumi Miyamoto, Kawasaki (JP); Yoshiaki Maruyama, Kawasaki (JP); Yuji Kamimoto, Yonago (JP)

(73) Assignee: Fujitsu Display Technologies Corporation, Kawasaki (JP)

( * ) Notice: Subject to any disclaimer, the term of this patent is extended or adjusted under 35 U.S.C. 154(b) by 448 days.

(21) Appl. No.: 09/280,955

(22) Filed: Mar. 29, 1999

(30) Foreign Application Priority Data

Dec. 8, 1998 (JP) .......................................... 10-347673

(51) Int. Cl.[7] ................................................ G09G 5/00
(52) U.S. Cl. ........................ 345/204; 345/87; 345/205
(58) Field of Search ............................... 345/204, 205, 345/87; 349/152, 149, 55

(56) References Cited

U.S. PATENT DOCUMENTS

| 4,910,383 A | 3/1990 | Zimmer ..................... 219/233 |
| 5,474,228 A | 12/1995 | Sato ...................... 228/180.21 |
| 5,479,051 A | 12/1995 | Waki et al. ................. 257/724 |
| 5,670,994 A | 9/1997 | Kawaguchi et al. ......... 345/206 |
| 5,712,493 A | 1/1998 | Mori et al. .................... 257/59 |
| 5,737,053 A * | 4/1998 | Yomogihara et al. ....... 349/149 |
| 5,754,171 A * | 5/1998 | Stoller ........................ 345/205 |
| 5,838,412 A | 11/1998 | Ueda et al. .................. 349/150 |
| 5,893,623 A * | 4/1999 | Muramatsu .................. 349/152 |
| 6,211,849 B1 * | 4/2001 | Sasaki et al. .................. 345/55 |

FOREIGN PATENT DOCUMENTS

| CN | 1158689 | 9/1997 |
| EP | 680 082 | 11/1995 |
| EP | 779 772 | 6/1997 |
| JP | 845986 | 2/1996 |
| WO | WO97/37275 | 10/1997 |

* cited by examiner

Primary Examiner—Richard Hjerpe
Assistant Examiner—Kimnhung Nguyen
(74) Attorney, Agent, or Firm—Greer, Burns & Crain, Ltd.

(57) ABSTRACT

The display apparatus has a common substrate and a TFT substrate, and a flexible printed board is attached to the TFT substrate. ICs are arranged in an area of the TFT substrate in a row along an alignment direction, and connection terminals are arranged in that area by the shorter sides of the ICs along the alignment direction of the ICs. The flexible printed board and ICs can be fitted to the TFT substrate, by an anisotropic electro-conductive film, using a thermo-compression bonding head or heads.

4 Claims, 16 Drawing Sheets

MATRIX TYPE DISPLAY APPARATUS, METHOD OF PRODUCTION THEREOF, AND THERMO-COMPRESSION BONDING HEAD

BACKGROUND OF THE INVENTION

1. Field of the Invention

The present invention relates to a matrix type display apparatus such as a liquid crystal display apparatus of a COG (chip-on-glass) system carrying driving ICs on a liquid crystal panel or a plasma display apparatus, a method for production thereof and a thermo-compression bonding head used for production of the matrix type display apparatus.

2. Description or the Related Art

FIG. 19 of the attached drawings is a schematic front view illustrating part of one conventional liquid crystal display apparatus of a COG system. In FIG. 19, reference numeral 1 denotes a liquid crystal panel; 2 denotes a common substrate on which a common electrode is formed; 3 denotes a TFT substrate on which pixel electrodes, data buses, gate buses; and TFTs (thin film transistors) are formed; and 4 denotes a display area for displaying images.

Reference numeral 5 denotes an area for mounting ICs for driving data buses provided on the TFT substrate 5; 6 to 10 denote ICs mounted thereon for driving the data buses; 11 denotes a group of connection terminals for connection to a flexible circuit board; and 12 denotes the flexible circuit board.

Reference numeral 13 denotes an area provided in the TFT substrate 3 for mounting ICs for driving the gate buses; and 14 denotes an IC mounted therein for driving the gate buses. In this regard, the data buses, gate buses or others are not shown in the drawing.

A flexible circuit board 12 is used for supplying a power source voltage for the data bus-driving ICs 6 to 10 and/or the gate bus-driving IC 14, or delivering signals necessary therefor, and is connected via an anisotropic conductive film by a thermo-contact bonding.

FIG. 20 is a schematic front view illustrating part of another conventional liquid crystal display apparatus of a COG system. In FIG. 20, reference numeral 16 denotes a liquid crystal panel; 17 a common substrate on which a common electrode is formed; and 18 denotes a TFT substrate on which pixel electrodes are formed; and 18 denotes a TFT substrate on which pixel electrodes, data buses, and TFTs are formed.

Reference numeral 19 denotes an area in which an IC for driving the data buses is mounted; 20 denotes the IC mounted therein for driving the data buses; 21 denotes the data buses; 22-1 to 22-4 and 23-1 to 23-4 denote connection terminals for connection to a flexible circuit board (not shown).

In a portable type information apparatus such as a notebook type or a mobile personal computer, it is required that a liquid crystal display apparatus has a narrower picture frame around the display area for the purpose of further miniaturization of the apparatus.

In the conventional liquid crystal display apparatus shown in FIG. 19, however, since the group of connection terminals 11 for connection to the flexible circuit board 12 are provided on a longer side of the respective data bus-driving ICs 6 to 10, it is impossible to narrow a width of the area 5 for mounting the data bus-driving ICs, and therefore, to realize a narrow-framed liquid crystal display apparatus.

The conventional liquid crystal display apparatus shown in FIG. 20 has the connection terminals 22-1 to 22-4 and 23-1 to 23-4 on the opposite shorter sides, respectively, of the data bus-driving IC 20. However, since the connection terminals 22-1 to 22-4 and 23-1 to 23-4 are arranged in the width wise direction in the area 19 for mounting the data bus-driving IC, it is impossible to reduce the width of the area 19 for mounting the data bus-driving IC, and therefore, to realize a narrow-framed liquid crystal display apparatus.

In addition, since leads for connecting the connection terminals 22-2 to 22-4 and 23-2 to 23-4 with the data bus-driving IC 20 extend from the longer side of the data bus-driving IC 20 in the conventional liquid crystal display apparatus shown in FIG. 20, it is impossible, in this regard, to reduce the width of the area 19 for mounting the data bus-driving IC, and therefore, to realize a narrow-framed liquid crystal display apparatus.

SUMMARY OF THE INVENTION

To solve the above-mentioned drawbacks in the prior art, an object of the present invention is to provide a matrix type display apparatus by which a narrow-framed structure is achievable, a method for production thereof and a thermo-contact bonding head suitably used for production of such a matrix type display apparatus.

A matrix type display apparatus according to the present invention comprises a first substrate, a second substrate disposed opposite to the first substrate and having an area for mounting a plurality of driving ICs in substantially one row along an alignment direction so that longer sides of the ICs are aligned with the arrangement direction, and connection terminals for connection with a third substrate, said connection terminals being arranged in the area for mounting the driving ICs at positions on the shorter sides of the respective driving ICs along the arrangement direction of the plurality of driving ICs.

According to the matrix type display apparatus of the present invention, since the connection terminals for connection to the third substrate are arranged on the shorter sides of the plurality of driving ICs to be aligned in the arrangement direction thereof, it is possible to reduce the width of the area for mounting the driving ICs.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

First to third aspects of a matrix type display apparatus according to the present invention, first to third aspects of a method for production of a matrix type display apparatus according to the present invention, and first and second aspects of a thermo-compression bonding head according to the present invention will be described in detail below with reference to FIGS. 1 to 18.

Figure 1:
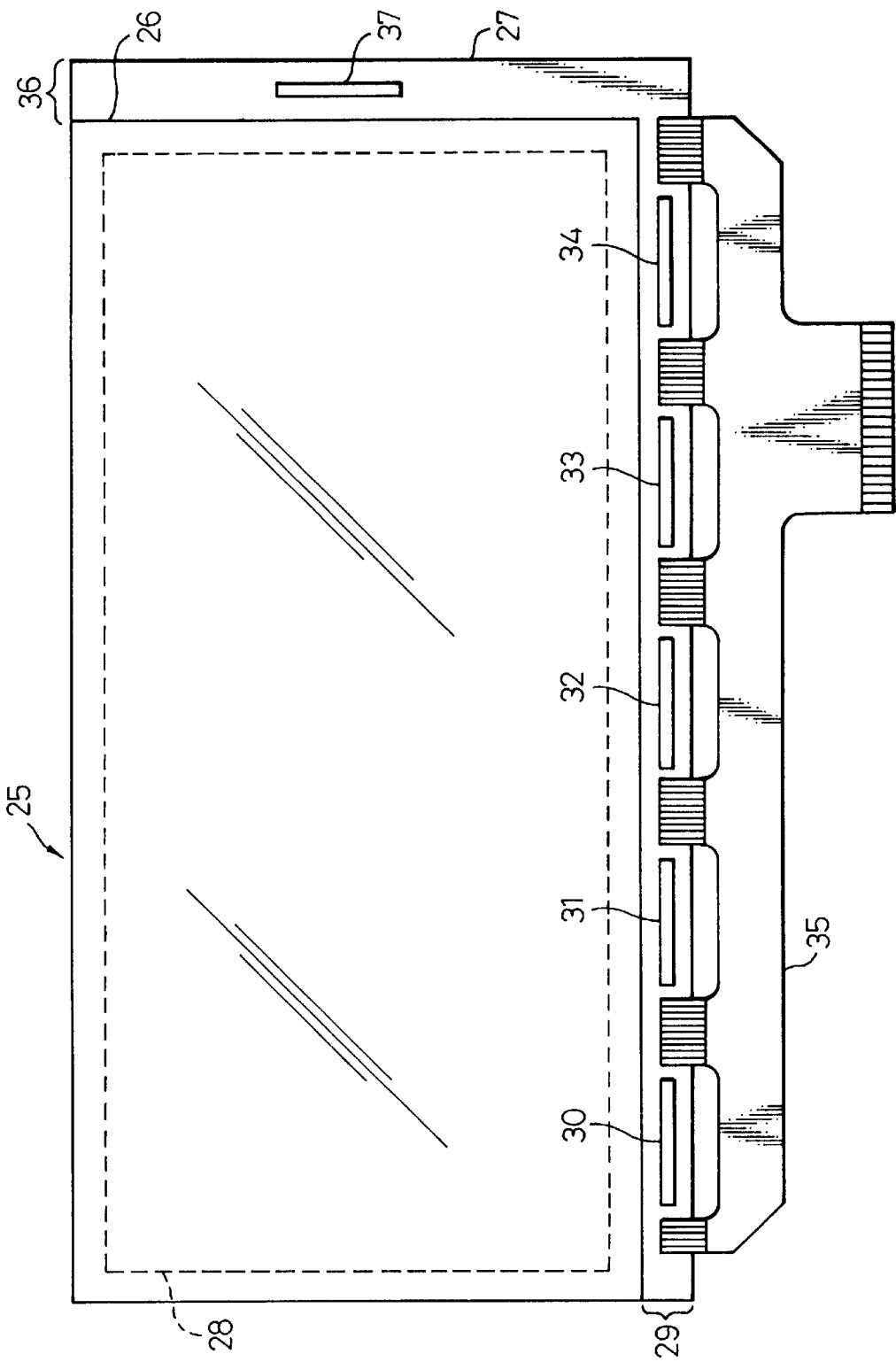
FIG. 1 is a schematic front view of part of a liquid crystal display apparatus as the first embodiment of a matrix type display apparatus according to the present invention.
Figure 2:
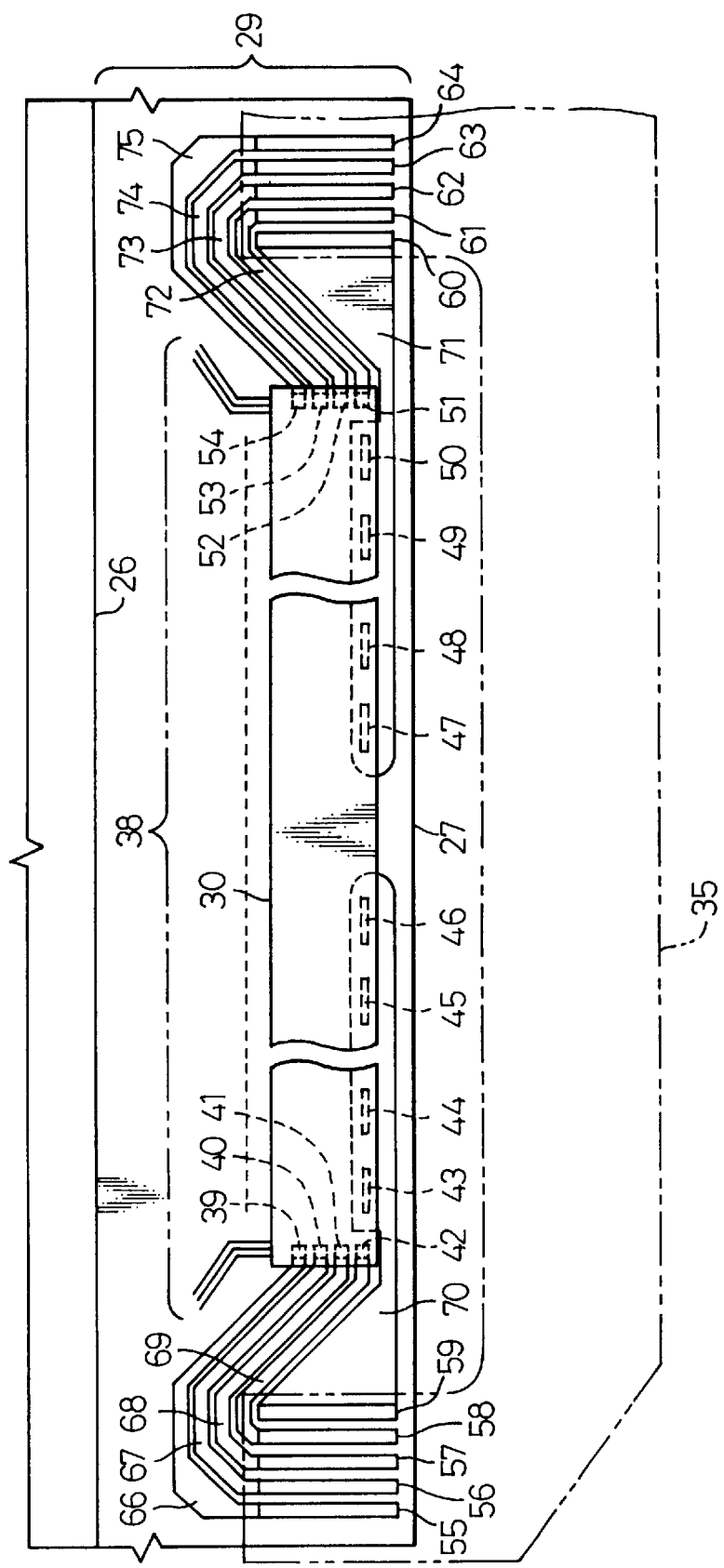
FIG. 2 is an enlarged schematic front view of part of an area for mounting data bus-driving ICs in the liquid crystal display apparatus as the first embodiment of the matrix type display apparatus according to the present invention.

First Aspect of Matrix Type Display Apparatus According to the Present Invention—FIGS. 1 and 2

FIG. 1 is a schematic front view of,part of a liquid crystal display apparatus according to a first embodiment of the present invention.

In FIG. 1, reference numeral 25 denotes a liquid crystal panel; 26 denotes a common substrate (first substrate) on which a common electrode is formed; 27 denotes a TFT substrate (second substrate) on which pixel electrodes, data buses, gate buses, and TFTS are formed; and 28 denotes an area on which images are displayed.

Reference numeral 29 denotes an area formed in the TFT substrate 27 for mounting ICs for driving data buses; 30 to 34 denote the mounted ICs for driving the data buses; and 35 denotes a flexible circuit board (third substrate) connected to the area 29 for mounting the data bus-driving ICs.

Reference numeral 36 denotes an area provided in the TFT substrate 27 for mounting gate bus-driving ICs; and 37 denotes the mounted IC for driving the gate buses.

Figure 21:
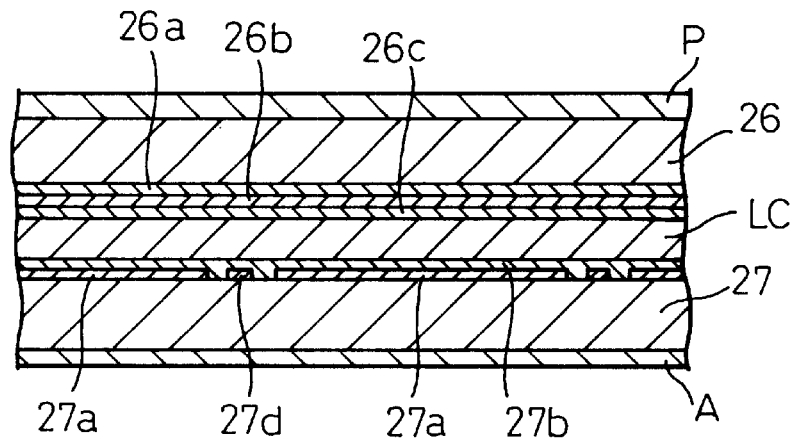
FIG. 21 is a cross-sectional view of the liquid crystal display apparatus.

FIG. 21 shows a liquid crystal display apparatus which comprises a common substrate 26, a TFT substrate 27 and a liquid crystal LC arranged between the substrates 26 and 27. The liquid crystal panel also includes a polarizer P and an analyzer A. The common substrate 26 has a color filter 26a, the common electrode 26b, and an alignment layer 26c. The TFT substrate 27 includes picture electrodes 27a, an alignment layer 27b.

Figure 22:
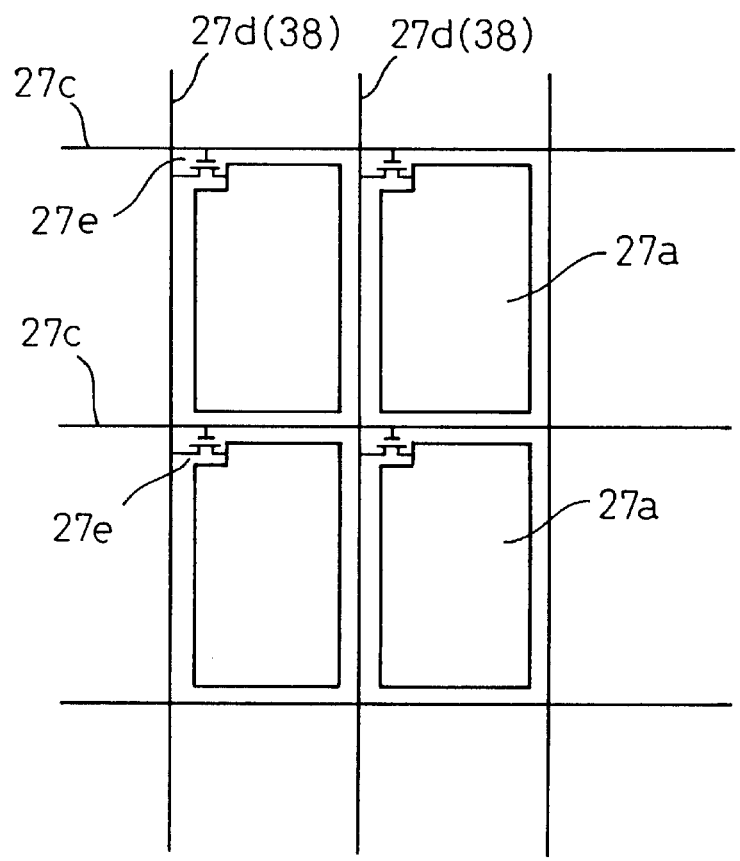
FIG. 22 is a schematic view illustrating the active matrix drive circuit provided on the TFT substrate.

FIG. 22 shows an active matrix drive circuit provided on the TFT substrate 27. The active matrix drive circuit includes the picture electrodes 27a, gate buses 27c, data buses 27d (data buses are represented by reference numerals 38 in FIG. 2), and TFTs (thin film transistors) 27e. The present invention can be also applied to other matrix type display apparatus such as a plasma display apparatus.

FIG. 2 is an enlarged schematic front view of part of the area 29 for mounting the data bus-driving ICs 30 to 34. In FIG. 2, reference numeral 38 denote data buses formed in the TFT substrate 27; 39 to 54 denote terminals provided in the data bus-driving IC 30; 55 to 64 denote connection terminal for connection to the flexible circuit board 35; and 66 to 75 denote leads for connecting connection terminals 55 to 64 to the data bus-driving. IC 30.

Regarding other data bus-driving ICs 31 to 34, connection terminals similar to those 55 to 64 and leads similar to those 66 to 75 for connecting the connection terminals 55 to 64 with the data bus-driving ICs are also provided.

That is in the liquid crystal display apparatus according to the first embodiment of the present invention, the connection terminals (for example, 55 to 64) for connection to the flexible circuit board 35 are provided in the area 29 for mounting the data bus-driving ICs at positions by or on the lateral side of the shorter sides of the respective data bus-driving ICs 30 to 34 in such a manner that the connection terminals are disposed in the arrangement direction of the ICs 30 to 34. The ICs 30 to 34 are arranged in a row or in an approximately one row along the arrangement direction.

The leads. (for example, 66 to 75) for connecting the connection terminals (for example, 55 to 64) used for connection to the flexible circuit board 35 with the data bus-driving ICs 30 to 34 extend from the shorter sides of the data bus-driving ICs 30 to 34.

As described above, according to the liquid crystal display apparatus which is the first embodiment of the matrix type display apparatus of the present invention, since the connection terminals (for example, 55 to 64) for connection to the flexible circuit board 35 are disposed in the area 29 for mounting the data bus-driving ICs at positions by the shorter sides of (on the side of shorter sides of) the data bus-driving ICs 30 to 34 to be aligned in the arrangement direction of the data bus-driving ICs 30 to 34, it is possible to reduce the width of the area 29 for mounting the data bus-driving ICs, and therefore to realize a liquid crystal display apparatus having a narrow picture frame with the area for mounting the data bus-driving ICS, on the upper or lower portion of the TFT substrate.

Also, since the leads (for example, 66 to 75) extend from the shorter sides of the data bus-driving ICs 30 to, 34, for connecting the connection terminals (for example, 55 to 64) used for connection to the flexible circuit board 35 with the data bus-driving ICs 30 to 34, it is possible in this regard to reduce the width of the area 29 for mounting the data bus-driving ICs, and therefore to realize a liquid crystal display apparatus having a narrow frame with the area for mounting the data bus-driving ICs on the upper or lower side of the TFT substrate.

First Aspect of Method for Producing Matrix Type Display Apparatus According to the Present Invention—FIGS. 3 to 6

FIGS. 3 to 6 are schematic cross-sectional views, respectively, of part of a process for producing the liquid crystal display apparatus shown in FIGS. 1 and 2, for illustrating a first embodiment of a method for a production of a matrix type display apparatus according to the present invention.

In the first embodiment of a method for production of a matrix type display apparatus according to the present invention, an anisotropic electro-conductive film 76 is first linearly adhered to the area 29 for mounting data bus-driving ICs so that the data bus-driving ICs 30 to 34 and the flexible circuit board 35 can be thermo-compression bonded to the area 29 for mounting data bus-driving ICs.

Figure 3:
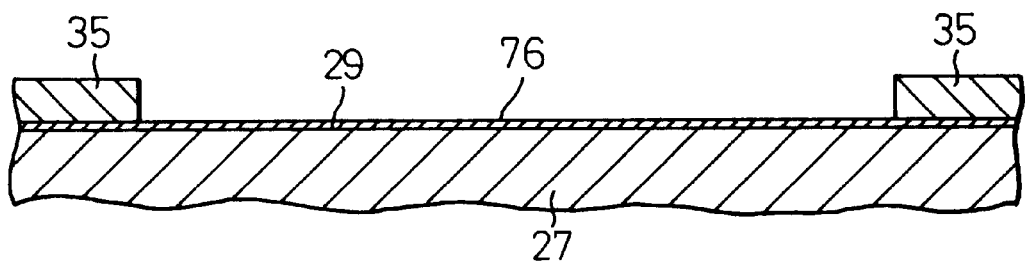
FIG. 3 is a schematic cross-sectional view illustrating a first embodiment of a method for production of the matrix type display apparatus according to the present invention.
Figure 4:
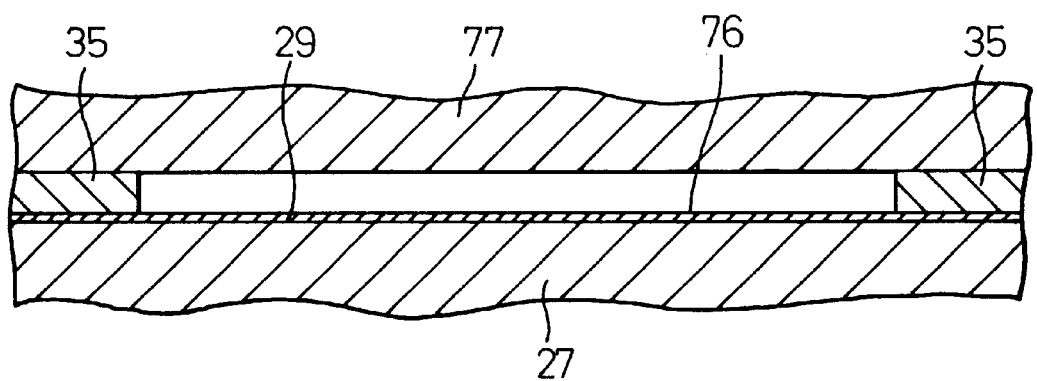
FIG. 4 is a schematic cross-sectional view illustrating the subsequent step of the first embodiment of a method for production of the matrix type display apparatus according to the present invention.

Then, as shown in FIG. 3, connecting parts of the flexible circuit board 35 are arranged at predetermined positions in the area for mounting the data bus-driving ICs. Thereafter, as shown in FIG. 4, the flexible circuit board 35 is thermo-compression bonded to the area 29 for mounting the data bus-driving ICs by the use of a thermo-compression bonding head 77.

Figure 5:
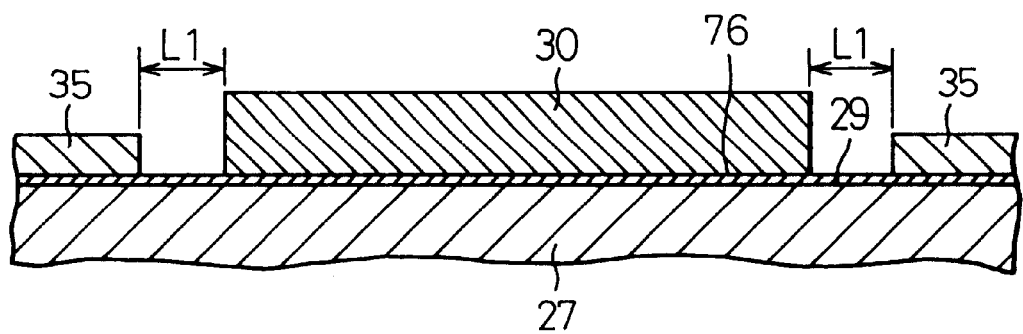
FIG. 5 is a schematic cross-sectional view illustrating the subsequent step of the first embodiment of a method for production of the matrix type display apparatus according to the present invention.
Figure 6:
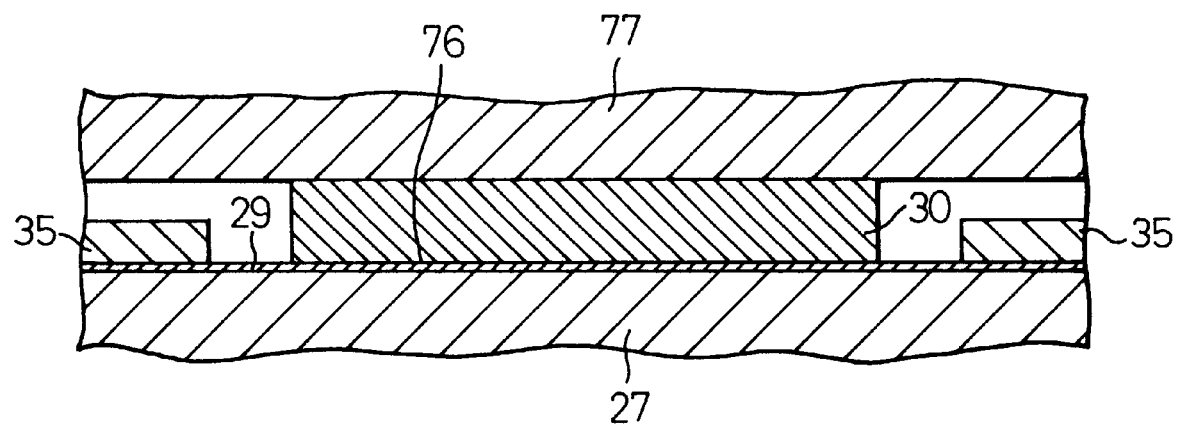
FIG. 6 is a schematic cross-sectional view illustrating the subsequent step of the first embodiment of a method for production of the matrix type display apparatus according to the present invention.

Next, as shown in FIG. 5, the data bus-driving ICs 30 to 34 are arranged at predetermined positions in the area 29 for mounting the data bus-driving ICs, then, as shown in FIG. 6, the thermo-compression bonding head 77 is used again for thermo-compression bonding the data bus-driving ICs 30 to 34 to the area 29 for mounting the data bus-driving ICs.

According to the first embodiment of the method for producing the matrix type display apparatus of the present invention, since the anisotropic electro-conductive film is linearly adhered to the area for mounting the data bus-driving ICs so that the data bus-driving ICs 30 to 34 and the flexible circuit board 35 are thermo-compression bonded thereto, the production efficiency is enhanced.

According to the first embodiment of the method for producing the matrix type display apparatus of the present invention, the flexible circuit board 35 is bonded to the area 29 prior to the mounting of the data bus-driving ICs 30 to 34, while taking into account the fact that the thickness of the data bus-driving ICs 30 to 34, which is approximately 1.0 mm, is larger than that of the flexible circuit board 35 which is approximately 0.2 mm. In such a case, the anisotropic electro-conductive film might be hardened in the vicinity of the shorter sides of the data bus-driving ICs 30 to 34. To solve such an inconvenience, a distance L1 between the respective data bus-driving IC and the flexible circuit board 35 is suitably selected to be 1.0 mm or more.

Figure 7:
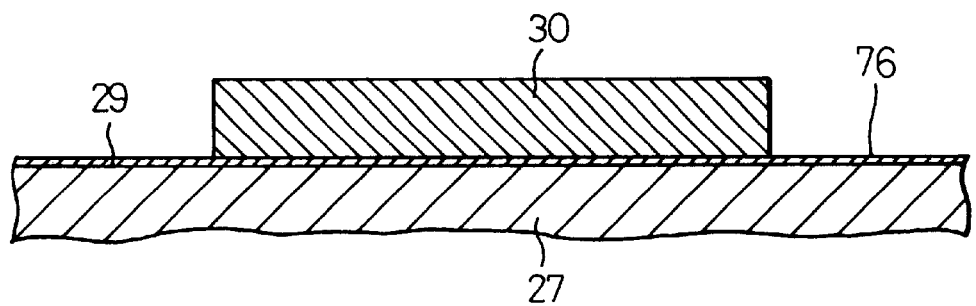
FIG. 7 is a schematic cross-sectional view illustrating a second embodiment of a method for production of the matrix type display apparatus according to the present invention.
Figure 10:
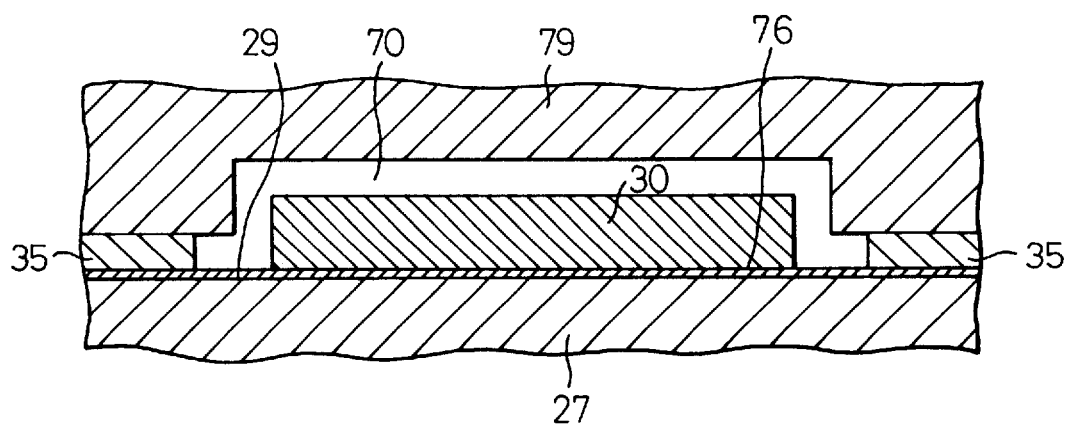
FIG. 10 is a schematic cross-sectional view illustrating a the subsequent step of the second embodiment of a method for production of the matrix type display apparatus according to the present invention.

Second Aspect of Method for producing Matrix Type Display Apparatus Acceding to the Present Invention—FIGS. 7 and 10

FIGS. 7 to 10 are schematic cross-sectional views, respectively, of part of a process for producing the liquid crystal display apparatus shown in FIG. 1, for illustrating a second embodiment or a method for production of a matrix type display apparatus.

In the second embodiment of a method for production of a matrix type display apparatus according to the present invention, an anisotropic electro-conductive film 76 is first linearly adhered to the area 29 for, mounting data bus-driving ICs so that the data bus-driving ICs 30 to 34 and the flexible circuit board 35 are capable of being thermo-compression bonded to the area 29 for mounting data bus-driving ICs.

Figure 8:
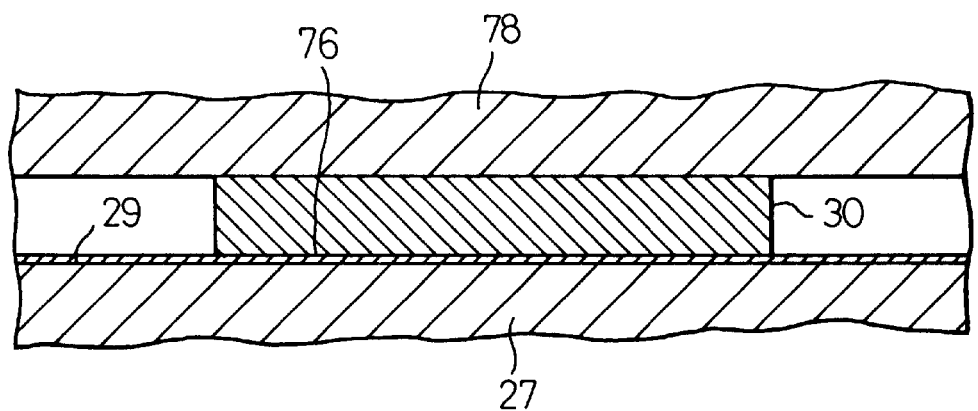
FIG. 8 is a schematic cross-sectional view illustrating the subsequent step of the second embodiment of a method for production of the matrix type display apparatus according to the present invention.

Next, as shown in FIG. 7, the data bus-driving ICs 30 to 34 are arranged at predetermined positions in the area 29 for mounting the data bus-driving ICs, then, as shown in FIG. 8, a thermo-compression bonding head 78 is used to linearly bond the data bus-driving ICs 30 to 34 to the area 29 for mounting the data bus-driving ICs.

Figure 9:
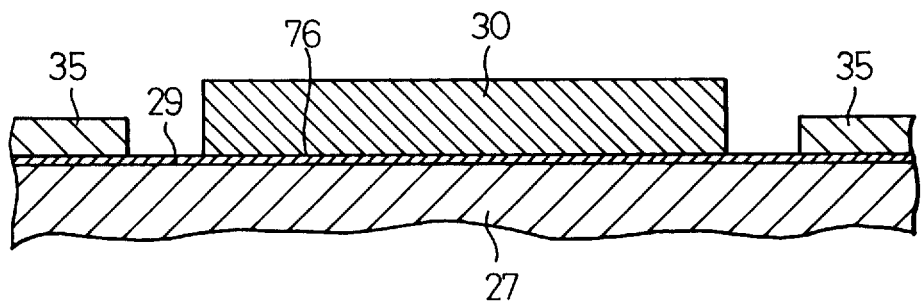
FIG. 9 is a schematic cross-sectional view illustrating the subsequent step of the second embodiment of a method for production of the matrix type display apparatus according to the present invention.

Next, as shown in FIG. 9, connecting parts of the flexible circuit board 35 are arranged at predetermined positions in an area 29 for mounting data bus-driving ICs, and as shown in FIG. 10, the flexible circuit board 35 is thermo-compression bonded to the area 29 for mounting the data bus-driving ICs by the use of a thermo-compression bonding head 79.

The thermo-compression bonding head 79 is a first embodiment of a thermo-compression bonding head according to the present invention, wherein a relief 70 is provided in the head so that the head is not brought into contact with each of the data bus-driving ICs 30 to 34 when the flexible circuit board 35 is thermo-contact bonded by the use of the head.

According to the second embodiment of the method for producing the matrix type display apparatus of the present invention, since the anisotropic electro-conductive film 76 is linearly adhered to the area 29 for mounting the data bus-driving ICs so that the data bus-driving ICs 30 to 34 and the flexible circuit board 35 are thermo-compression bonded thereto, the production efficiency is enhanced.

Also, since the data bus-driving ICs 30 to 34 are bonded prior to the bonding of the flexible circuit board 35, it is possible to avoid an inconvenience in that portions of the anisotropic electro-conductive film in the vicinity of the shorter sides of the data bus-driving ICs 30 to 34 are hardened before the data bus-driving ICs 30 to 34 have been bonded.

Accordingly, it is possible to reduce the distance between the data bus-driving ICs 30 to 34 and the flexible circuit board 35 and widen the connecting portions of the flexible circuit board 35 to firmly bond the flexible circuit board 35 to the area 29 for mounting the data bus-driving ICs.

Figure 11:
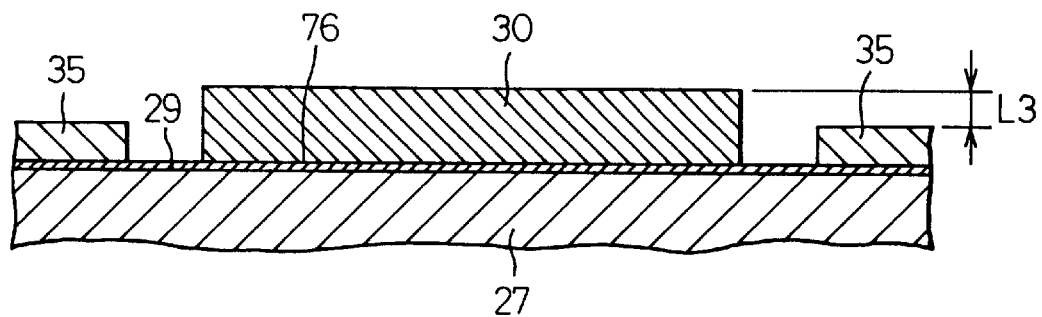
FIG. 11 is a schematic cross-sectional view illustrating a third embodiment for production of the matrix type display apparatus according to the present invention.
Figure 12:
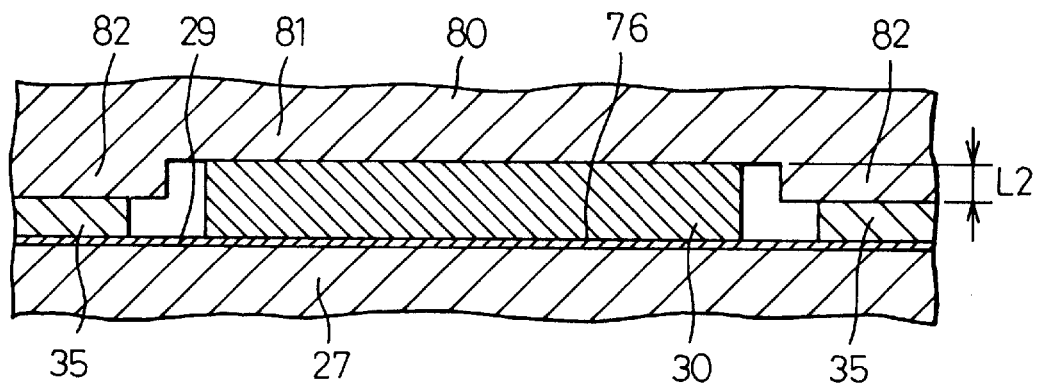
FIG. 12 is a schematic cross-sectional view illustrating the subsequent step of the third embodiment of a method for production of the matrix type display apparatus according to the present invention.

Third Aspect of Method for Producing Matrix Type Display Apparatus According to the Present Invention—FIGS. 11 and 12

FIGS. 11 to 12 are schematic cross-sectional views, respectively, of part of a process for producing the liquid crystal display apparatus shown in FIG. 1, for illustrating a third embodiment of a method for production of a matrix type display apparatus according to the present invention.

In the third embodiment of a method for production of a matrix type display apparatus according to the present invention, an anisotropic electro-conductive film 76 is first linearly adhered to the area 29 for mounting data bus-driving ICs so that the data bus-driving ICs 30 to 34 and the flexible circuit board 35 can be thermo-compression bonded to the area 29 for mounting data bus-driving ICs.

Next, as shown in FIG. 11, the data bus-driving ICs 30 to 34 are arranged at predetermined positions in the area 29 for mounting the data bus-driving ICs, then, as shown in FIG. 12, a thermo-compression bonding head 80 is used for thermo-compression bonding the data bus-driving ICs 30 to 34 and the flexible circuit board 35 at the same time to the area-29 for mounting the data bus-driving ICs.

The thermo-compression bonding head 80 is a second embodiment of a thermo-compression bonding head according to the present invention, comprising a head section 81 for bonding the data bus-driving ICs and a head section 82 for bonding the flexible circuit board 82, wherein a height difference L2, between a contact portion of the head section 81 to be in contact with the data bus-driving IC and a contact portion of the head section 82 to be in contact with the flexible circuit board 35, is selected to be equal to a thickness difference L3 between the data bus-driving ICs 30 to 34 and the flexible circuit board 35.

According to the third embodiment of the method for producing the matrix type display apparatus of the present invention, since the anisotropic electro-conductive film is linearly adhered to the area for mounting the data bus-driving ICs so that the data bus-driving ICs 30 to 34 and the flexible circuit board 35 are thermo-compression bonded thereto, the production efficiency is enhanced.

Since the data bus-driving ICs 30 to 34 and the flexible circuit board 35 are thermo-compression bonded at the same time to the area 29 for mounting the data bus-driving ICs by the use of the thermo-compression bonding head 80, the production efficiency is also enhanced in this respect.

Since the data bus-driving ICs 30 to 34 and the flexible circuit board 35 are thermo-contact bonded at the same time to the area 29 for mounting the data bus-driving ICs, it is possible to avoid an inconvenience in that the anisotropic electro-conductive film might be hardened in the vicinity of the shorter sides of the data bus-driving ICs 30 to 34 before the data bus-driving ICs have been bonded.

Accordingly, it is possible to reduce the distance between the data bus-driving ICs 30 to 34 and the flexible circuit board 35 and widen the connecting portions or the flexible circuit board 35 to firmly bond the flexible circuit board 35 to the area 29 for mounting the data bus-driving ICs.

Figure 13:
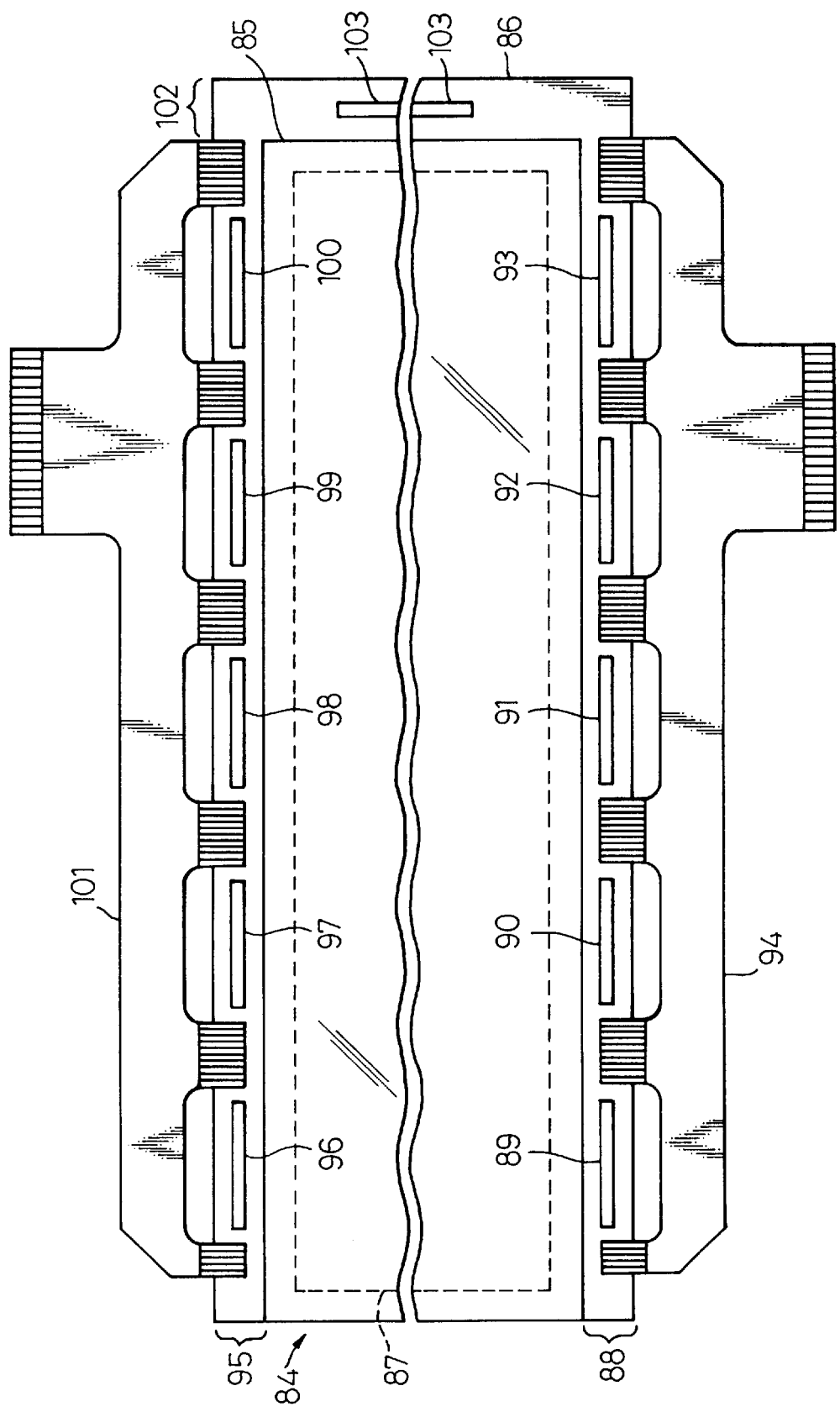
FIG. 13 is a schematic front view of part of a liquid crystal display apparatus as a second embodiment of a matrix type display apparatus according to the present invention.
Figure 14:
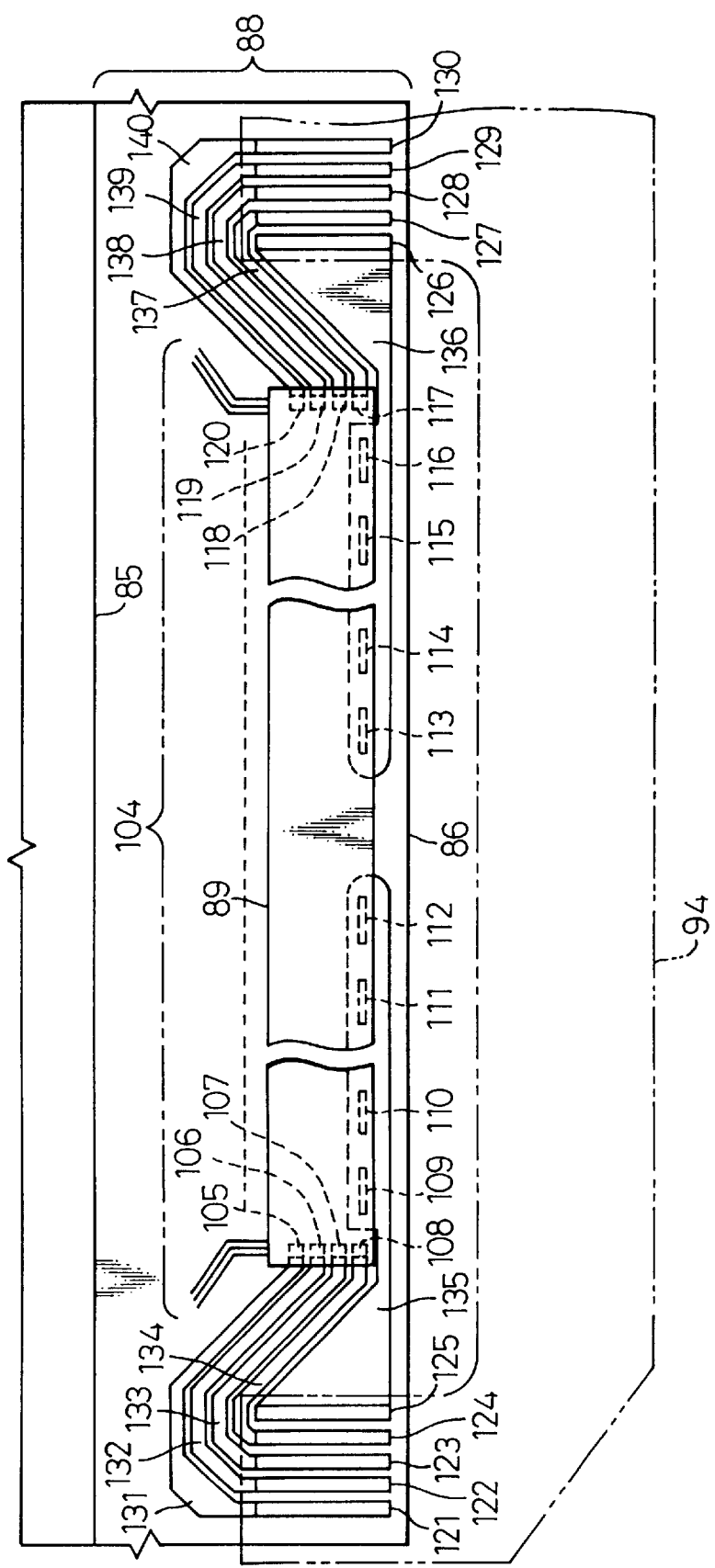
FIG. 14 is an enlarged schematic front view of part of a first area for mounting data bus-driving ICs in the liquid crystal display apparatus of the second embodiment of a matrix type display apparatus according to the present invention.
Figure 15:
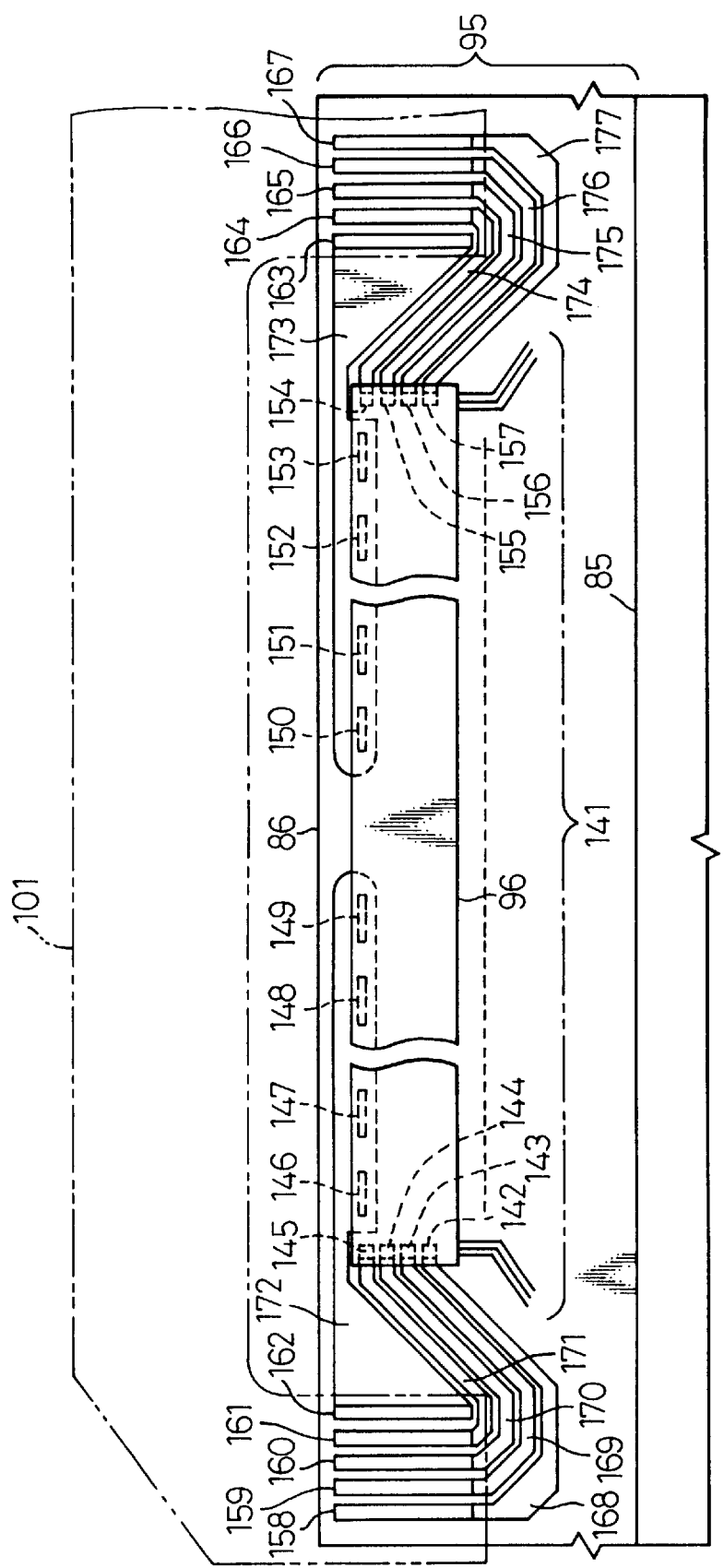
FIG. 15 is an enlarged schematic front view of part of a second area for mounting data bus-driving ICs in the liquid crystal display apparatus of the second embodiment of a matrix type display apparatus according to the present invention.

Second Aspect of Matrix Display Apparatus According to the Present Invention—FIGS. 13 to 15

FIG. 13 is a schematic front view of part of a liquid crystal display apparatus according to a second embodiment of the present invention.

In FIG. 13 reference numeral 84 denotes a liquid crystal panel; 85 denotes a common substrate on which a common electrode is formed; 86 denotes a TFT substrate on which pixel electrodes, data buses, gate buses, and TFTs are formed; and 87 denotes an area on which images are displayed.

Reference numeral 88 denotes a first area formed in the TFT substrate 86 for mounting ICs for driving data buses; 89 to 93 denote the mounted ICS for driving the data buses; and 94 denotes a flexible circuit board connected to the area 88 for mounting the data bus-driving ICs.

Reference numeral 95 denotes a second area provided in the TFT substrate 86,for mounting data bus-driving ICs; 96 to 100 denote the mounted data bus-driving ICs; and 101 denotes the flexible circuit board.

Reference numeral 102 denotes an area provided in the TFT substrate 86 for mounting gate bus-driving ICs; and 103 denotes the mounted gate bus-driving IC. The data buses, gate buses or others are not illustrated.

FIG. 14 is an enlarged schematic front view of part of the area 88 for mounting the data bus-driving IC. In FIG. 14, reference numeral 104 denotes a data bus formed in the TFT substrate 86; 105 to 120 denote terminals provided in the data bus-driving IC 89; 121 to 130 denote connection terminals for connection to the flexible circuit board 94; and 131 to 140 denote leads for connecting the connection terminals 121 to 130 with the data bus-driving IC 89.

In relation to the data bus-driving ICs 90 to 93, connection terminals similar to those 121 to 130 and leads for connecting the same with the other data bus-driving ICs 90 to 93 are also provided in a similar manner as described above.

That is, in the liquid crystal display apparatus according to the second embodiment of the present invention, the connection terminals (for example, 121 to 130) for connection to the flexible circuit board 94 are provided in the area 88 for mounting the data bus-driving ICs at positions on the shorter sides of the respective data bus-driving ICs 89 to 93 in such a manner that the connection terminals are disposed in the arrangement direction of the ICs 89 to 93.

The leads (for example, 131 to 140) for connecting the connection terminals (for example, 121 to 130) used for connection to the flexible circuit board 35 with the data bus-driving ICs 89 to 93 extend from the shorter sides of the data bus-driving ICs 89 to 93.

FIG. 15 is an enlarged schematic front view of part of the area 95 for mounting the IC for driving the data bus. In FIG. 15, reference numeral 141 denotes a data bus formed in the TFT substrate 86; 142 to 157 denote terminals provided in the data bus-driving IC 96; 158 to 167 denote connection terminal for connection to the flexible circuit board 101; and 168 to 177 denote leads for connecting connection terminals 158 to 167 to the data bus-driving IC 96.

Regarding the ICs 97 to 100, connection terminals similar to those 158to 167 and leads similar to these used for connecting the connection terminals 158 to 167 with the data bus-driving ICs are also provided.

That is, in the liquid crystal display apparatus according to the second embodiment of the present invention, the connection terminals (for example, 158 to 167) for connection to the flexible circuit board 101 are provided in the area 95 for mounting the data bus-driving ICs at positions on the shorter sides of the respective data bus-driving ICs 96 to 100 in such a manner that the connection terminals are disposed in the arrangement direction of the ICs 96 to 100.

The leads (for example, 168 to 177) for connecting the connection terminals (for example, 158 to 167) used for connection to the flexible circuit board 101 with the data bus-driving ICs 96 to 100 extend from the shorter sides of the data bus-driving ICs 96 to 100.

As described above, according to the liquid crystal display apparatus which is the second embodiment of the matrix type display apparatus of the present invention, since the connection terminals (for example, 121 to 130) for connection to the flexible circuit board 94 are disposed in the area 88 for mounting the data bus-driving ICs at positions on the shorter sides of the data bus-driving ICs 89 to 93 to be aligned to the arrangement direction of the data bus-driving ICs 89 to 93 and the connection terminals (for example, 158 to 167) for connection to the flexible circuit board 101 are disposed in the area 95 for mounting the data bus-driving ICs at positions on the shorter sides of the data bus-driving ICs 96 to 100 to be aligned in the arrangement direction of the data bus-driving ICs 96 to 100, it is possible to reduce the width of the areas 88, 95 for mounting the data bus-driving ICs, and therefore to realize a narrow-framed liquid crystal display apparatus having the areas for mounting the data bus-driving ICs on the upper and lower sides of the TFT substrate.

Also, since the leads (for example, 131 to 140) extend from the shorter sides of the data bus-driving ICs 89 to 93, for connecting the connection terminals (for example, 121 to 130) used for connection to the flexible circuit board 94 with the data bus-driving ICs 89 to 93 and the leads (for example, 168 to 177) extend from the shorter sides of the data bus-driving ICs 96 to 100, for connecting the connection terminals (for example, 158 to 167) used for connection to the flexible circuit board 101 with the data bus-driving ICs 796 to 100, it is possible in this regard to reduce the width of the areas 88, 95 for mounting the data bus-driving ICs, and therefore to realize a narrow-framed liquid crystal display apparatus having the areas for mounting the data bus-driving ICs on the upper and lower sides of the TFT substrate.

Figure 16:
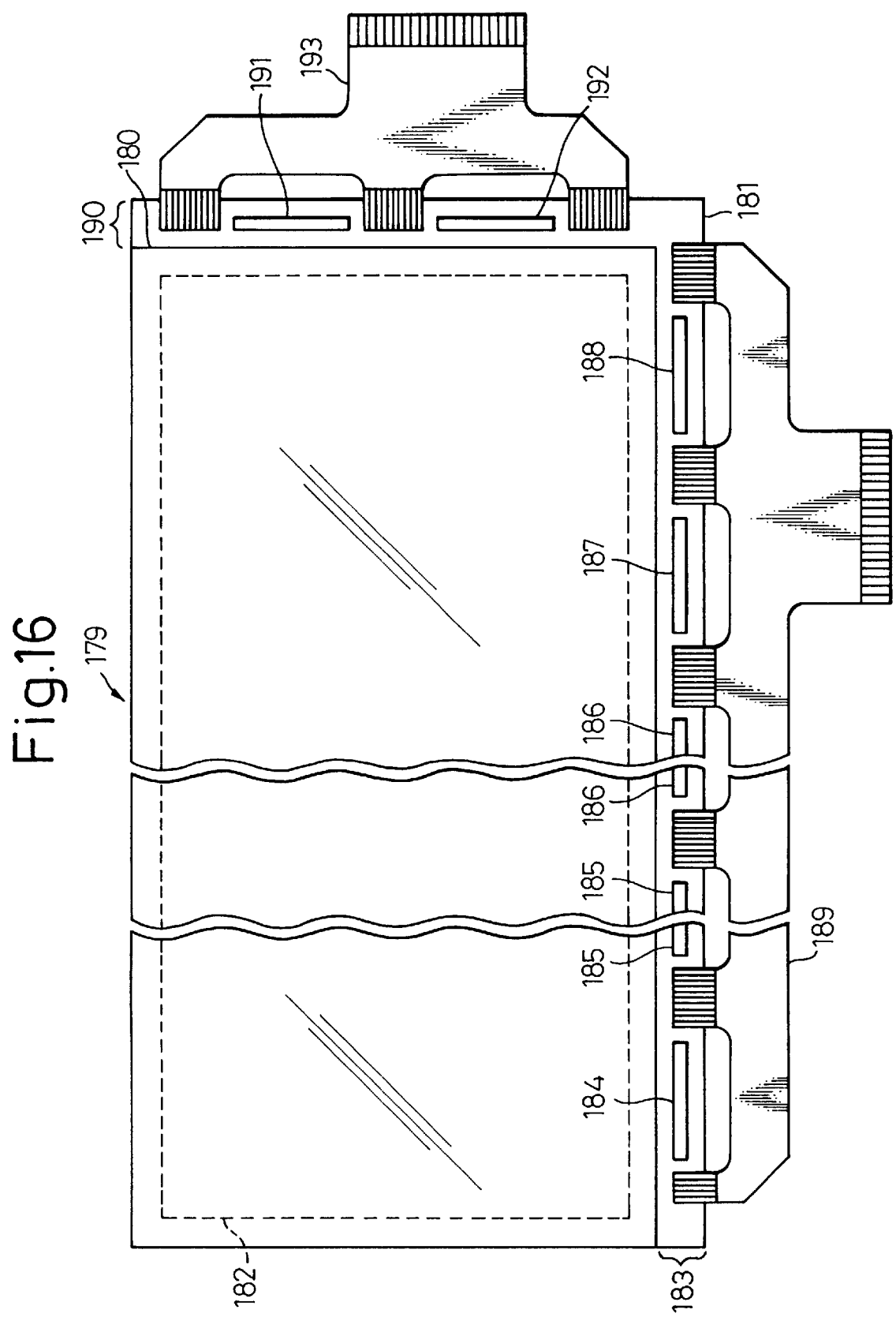
FIG. 16 is a schematic front view of part of a liquid crystal display apparatus as a third embodiment of a matrix type display apparatus according to the present invention.
Figure 17:
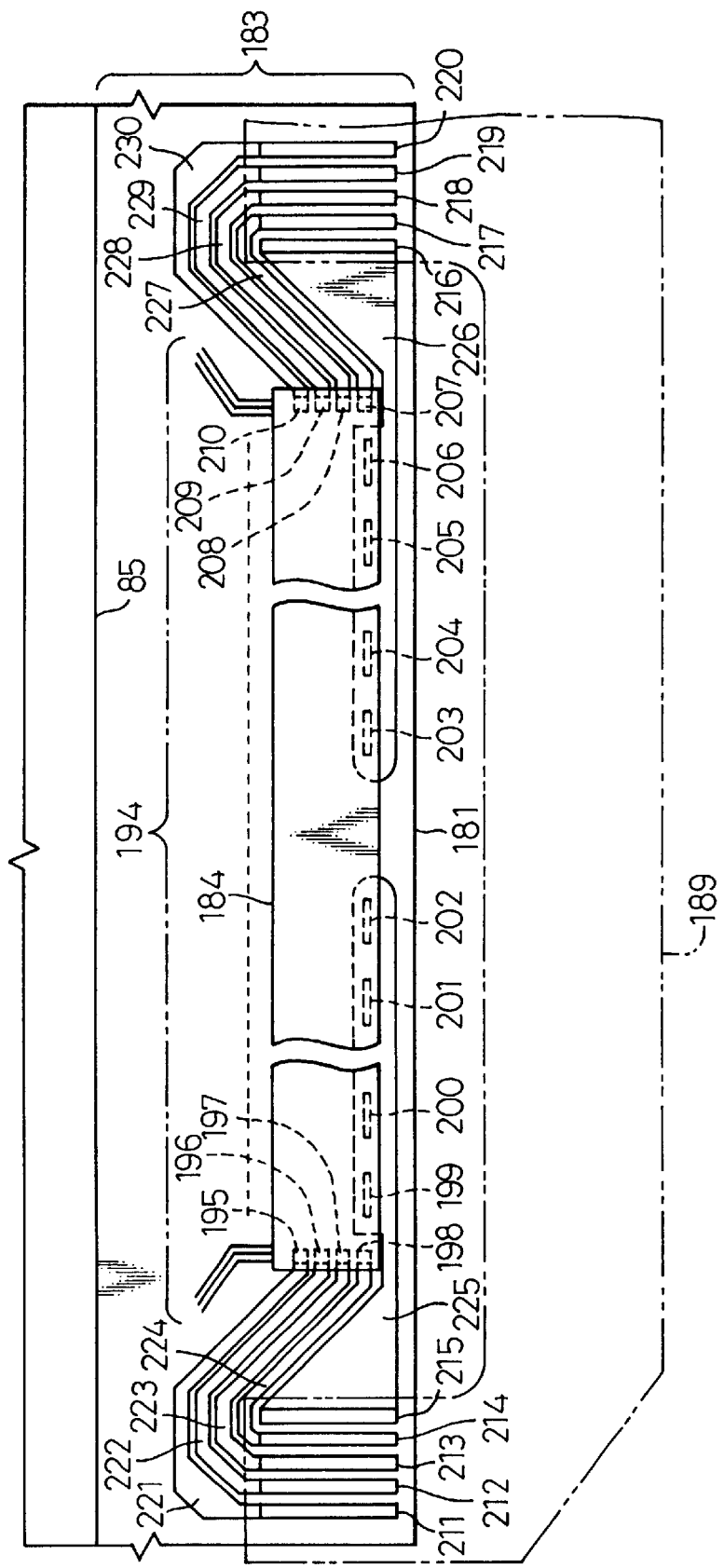
FIG. 17 is an enlarged schematic front view of part of an area for mounting data bus-driving ICs in the liquid crystal display apparatus of the third embodiment of a matrix type display apparatus according to the present invention.
Figure 18:
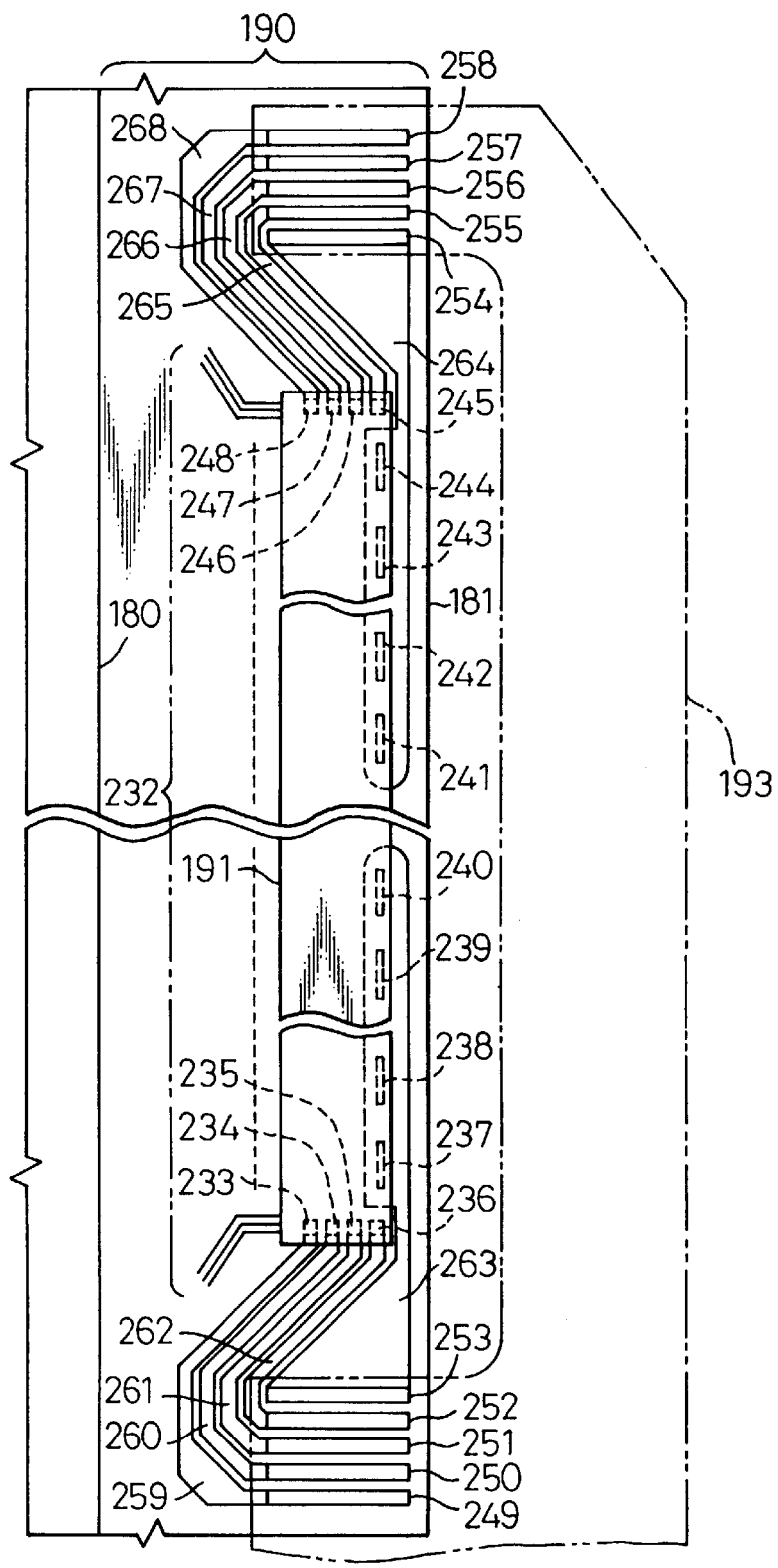
FIG. 18 is an enlarged schematic front view of part of an area for mounting gate bus-driving ICs in the liquid crystal display apparatus of the third embodiment of a matrix type display apparatus according to the present invention.
Figure 19:
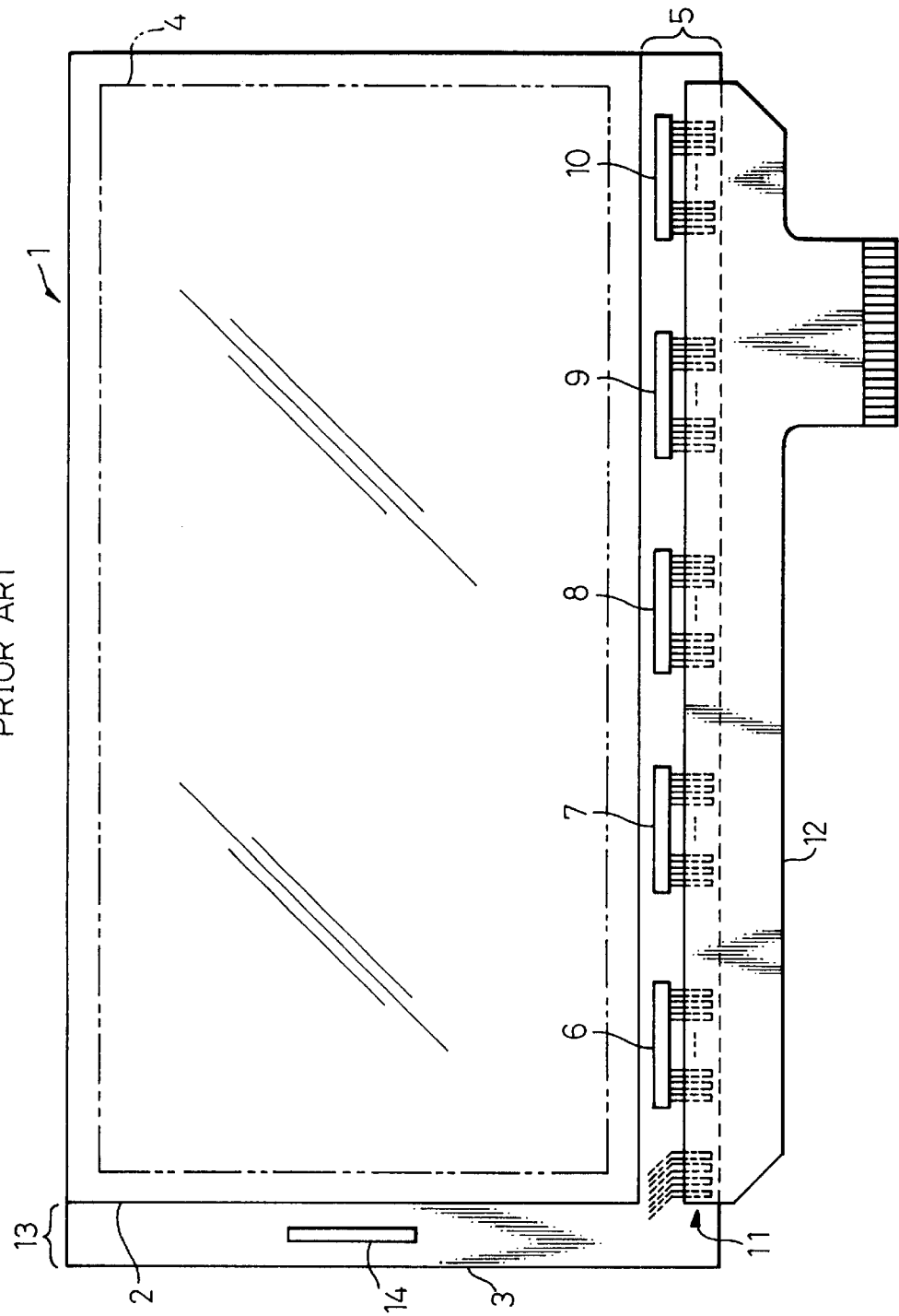
FIG. 19 is a schematic front view of part of a conventional liquid crystal display apparatus of a COG system.
Figure 20:
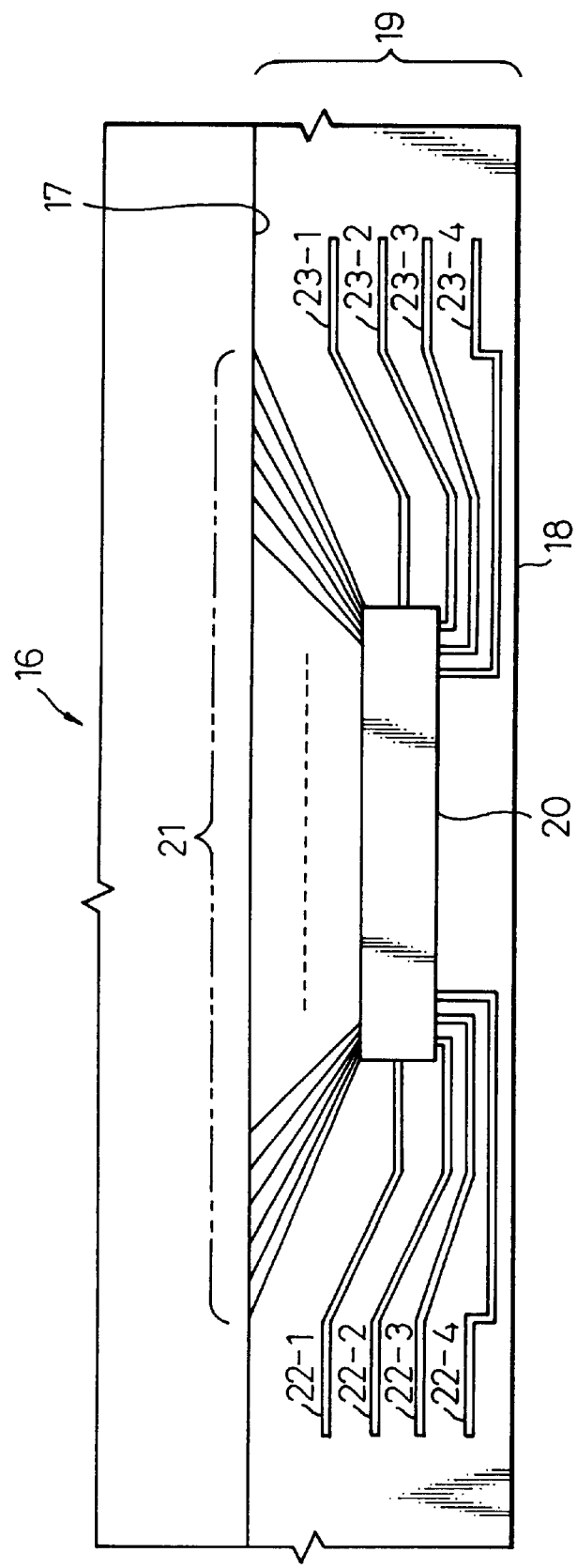
FIG. 20 is a schematic front view of part of another conventional liquid crystal display apparatus of a COG system.

Third Aspect of Matrix Type Display Apparatus
According to the Present Invention—FIGS. 16 to 18

FIG. 16 is a schematic front view of part of a liquid crystal display apparatus according to a first embodiment of the present invention.

In FIG. 16, reference numeral 179 denotes a liquid crystal panel; 180 denotes a common substrate on which common electrodes are formed; 181 denotes a TFT substrate on which pixel electrodes, data buses, gate buses, TFTs or others are formed; and 182 denotes an area on which images are displayed.

Reference numeral 183 denotes an area formed in the TFT substrate 181 for mounting ICs for driving data buses; 184 to 188 denotes the mounted ICs for driving the data buses; and 189 denotes a flexible circuit board connected to the area 183 for mounting the data bus-driving ICs.

Reference numeral 190 denotes an area provided in the TFT substrate 181 for mounting ICs for driving gate buses; and 191, 192 denote the mounted ICs for driving the gate buses. In this regard, the data buses, gate buses or others are not shown in the drawing.

FIG. 17 is an enlarged schematic front view of part of the area 183 for mounting the data bus-driving IC. In FIG. 17, reference numeral 194 denotes a data bus formed in the TFT substrate 181; 195 to 210 denote terminals provided in the data bus-driving IC 184; 211 to 220 denote connection terminal for connection to the flexible circuit board 189; and 221 to 230 denote leads for connecting connection terminals 211 to 220 to the data bus driving IC 184.

Connection terminals similar to 211 to 220 and leads used for connecting the connection terminals 221 to 230 with the data bus-driving ICs 185 to 188 are also provided.

That is, in the liquid crystal display apparatus according to the third embodiment of the present invention, the connection terminals (for, example, 211 to 220) for connection to the flexible circuit board 189 are provided in the area 183-for mounting the data bus-driving ICs at positions on the shorter sides of the respective data bus-driving ICs 184 to 188 in such a manner that the connection terminals are disposed in the arrangement direction of the ICs 30 to 34.

The leads (for example, 221 to 230) for connecting the connection terminals (for example, 211 to 220) used for connection to the flexible circuit board 189 with the data bus-driving ICs 184 to 188 extend from the shorter sides of the data bus-driving ICs 184 to 188.

FIG. 18 is an enlarged schematic front view of part of the area 190 for mounting the IC for driving the data bus. In FIG. 18, reference numeral 232 denotes a gate bus formed in the TFT substrate 181; 233 to 248 denote terminals provided in the gate bus-driving IC 191; 249 to 258 denote connection terminal for connection to the flexible circuit board 193; and 259 to 268 denote leads for connecting connection terminals 249 to 258 to the gate bus-driving IC 191.

Connection terminals similar to those 249 to 258 and leads used for connecting the connection terminals 249 to 258 with the gate bus-driving IC 192 are also provided.

That is, in the liquid crystal display apparatus according to the third embodiment of the present invention, the connection terminals (for example, 249 to 258) for connection to the flexible circuit board 193 are provided in the area 190 for mounting the gate bus-driving ICs at positions on the shorter sides of the respective gate bus-driving ICs 191, 192 in such a manner that the connection terminals are disposed in the arrangement direction of the ICs 191 to 192.

The leads (for example, 259 to 268) for connecting the connection terminals (for example, 211 to 220) used for connection to the flexible circuit board 193 with the gate bus-driving ICs 191 and 192 extend from the shorter sides of the gate bus-driving ICs 191 and 192.

As described above, according to the liquid crystal display apparatus which is the third embodiment of the matrix type display apparatus of the present invention, since the connection terminals (for example, 211 to 220) for connection to the flexible circuit board 189 are disposed in the area 183 for mounting the data bus-driving ICs at positions on the shorter sides of the data bus-driving ICs 184 to 188 to be aligned in the arrangement direction of the data bus-driving ICs 30 to 34, and the connection terminals (for example, 249 to 258) for connection to the flexible circuit board 193 are disposed in the area 190 for mounting the gate bus-driving ICs at positions on the shorter sides of the gate bus-driving ICs 191 and 192 to be aligned in the arrangement direction of the data bus-driving ICs 191, 192, it is possible to reduce the width of the area 183 for mounting the data bus-driving ICs and that 190 for mounting the gate bus-driving ICs, and therefore to realize a narrow frame liquid crystal display apparatus having the area for mounting the data bus-driving ICs on the upper or lower side of the TFT substrate and the area for mounting the gate bus-driving ICs on the righthand or lefthand side thereof.

Also, since the leads (for example, 259 to 268) extend from the shorter sides of the data bus-driving ICs 184 to 188, for connecting the connection terminals (for example, 211 to 220) used for connection to the flexible circuit board 189 with the data bus-driving ICs 183 to 188, and the leads (for example, 259 to 268) extend from the shorter sides of the gate bus-driving ICs 191 and 192, for connecting the connection terminals (for example, 249 to 258) used for connection to the flexible circuit board 193 with the gate bus-driving ICs 191 and 192, it is possible in this regard to reduce the width of the area 183 for mounting the data bus-driving ICs and the area 190 for mounting the gate bus-driving ICs, and therefore to realize a narrow frame liquid crystal display apparatus having the area for mounting the data bus-driving ICs on the upper or lower side of the TFT substrate and that for mounting the gate bus-driving ICs on the righthand or lefthand side thereof.

As described above, according to the matrix type display apparatus of the present invention, since connection terminals for connection to a third substrate are disposed in an area for mounting driving ICs at positions on the shorter sides of the driving ICs to be aligned in the arrangement direction thereof, it is possible to reduce the width of the area for mounting the driving ICs, and therefore, to realize a narrow frame liquid crystal display apparatus.

According to the first embodiment of a method for producing the matrix type display apparatus of the present invention, an anisotropic electro-conductive film is linearly adhered to the area for mounting driving ICs so that the driving ICs and the third substrate are capable of being thermo-contact bonded to the area for mounting the driving ICs, whereby it is possible to enhance the production efficiency of the apparatus.

According to the second embodiment of a method for producing the matrix type display apparatus of the present invention, an anisotropic electro-conductive film is linearly adhered to the area for mounting driving ICs so that the driving ICs and the third substrate are capable of being thermo-contact bonded to the area for mounting the driving ICs, whereby it is possible to enhance the production efficiency of the apparatus.

Also, since the driving ICs are bonded prior to the bonding of the third substrate, it is possible to avoid an inconvenience in that a portion of the anisotropic electro-conductive film on the shorter sides of the driving ICs is hardened before the driving ICs have been bonded, and therefore, to minimize a distance between the driving ICs and the third substrate to widen a connecting portion of the third substrate so that the third substrate is firmly bonded to the area for mounting the driving ICs.

According to the third embodiment of a method for producing the matrix type display apparatus of the present invention, an anisotropic electro-conductive film is linearly adhered to the area for mounting driving ICs so that the driving ICs and the third substrate are capable of being thermo-contact bonded to the area for mounting the driving ICs, whereby it is possible to enhance the production efficiency of the apparatus.

Since the plurality of driving ICs and third substrate are thermo-contact bonded at the same time in the area for mounting the driving ICs the production efficiency is enhanced also in this respect.

Also, since the driving ICs and the third substrate are thermo-contact bonded to the area for mounting the data bus-driving ICs at the same time, it is possible to avoid an inconvenience in that a portion of the anisotropic electro-conductive film on the shorter sides of the driving ICs is hardened before the driving ICs have been bonded, and therefore, to minimize a distance between the driving ICs and the third substrate to widen a connecting portion of the third substrate so that the third substrate is firmly bonded to the area for mounting the driving ICs.

When the first embodiment of the thermo-contact bonding head according to the present invention is used, it is possible to carry out the second embodiment of the method for production of the matrix type display apparatus, which results in the enhancement of the production efficiency and the firm bonding of the third substrate to the area for mounting the driving ICS.

When the second embodiment of the thermo-contact bonding head according to the present invention is used, it is possible to carry out the third embodiment of the method for production of the matrix type display apparatus, which results in the enhancement of the production efficiency and the firm bonding of the third substrate to the area for mounting the driving ICs.

What is claimed is:

1. A matrix type display apparatus comprising;

a first substrate;

a second substrate disposed opposite to said first substrate and having an area for mounting a plurality of driving ICs, generally in a row in a first direction parallel to one side of said second substrate so that longer sides of said driving ICs are aligned in said first direction; and connection terminals for connection with a third substrate, said connection terminals being arranged in a row in said first direction in said area for mounting said driving ICs at positions by shorter sides of respective driving ICs.

2. A matrix type display apparatus as defined by claim 1, characterized in that leads for connecting the connection terminals with the driving ICs extend from the shorter sides of the driving ICs.

3. A matrix type display apparatus as defined by claim 1 or 2, characterized in that the driving ICs are ICs for driving data buses.

4. A matrix type display apparatus as defined by claim 1, characterized in that a distance between the driving IC and the third substrate in the arrangement direction of the plurality of driving ICs is 1.0 mm or more.

* * * * *